United States Patent [19]
Bruene

[11] Patent Number: 4,493,112
[45] Date of Patent: Jan. 8, 1985

[54] ANTENNA TUNER DISCRIMINATOR

[75] Inventor: Warren B. Bruene, Dallas, Tex.

[73] Assignee: Rockwell International Corporation, El Segundo

[21] Appl. No.: 322,822

[22] Filed: Nov. 19, 1981

[51] Int. Cl.³ .......................... H04B 1/04; H03H 7/40
[52] U.S. Cl. .................................... 455/123; 455/115; 455/129; 333/17 M; 343/861
[58] Field of Search ............ 343/703, 861; 333/17 M, 333/32, 17 R; 324/58 R, 58 A, 58 B; 455/115, 117, 120, 121, 123, 124, 125, 122, 129, 67

[56] References Cited
U.S. PATENT DOCUMENTS

| | | | |
|---|---|---|---|
| 3,443,231 | 5/1969 | Roza | 333/17 M |
| 3,715,690 | 2/1973 | Young et al. | 333/17 R |
| 3,919,643 | 11/1975 | Templin | 333/17 M |
| 3,995,237 | 11/1976 | Brunner | 333/17 M |
| 4,015,223 | 3/1977 | Chezé | 333/17 M |
| 4,028,645 | 6/1977 | Tressa | 333/17 M |
| 4,356,458 | 10/1982 | Armitage | 333/17 M |

OTHER PUBLICATIONS

Bruene, "An Inside Picture of Directional Wattmeters", *QST* Apr., 1959, pp. 24–28.

Primary Examiner—Eli Lieberman
Assistant Examiner—Michael C. Wimer
Attorney, Agent, or Firm—Michael E. Taken; V. Lawrence Sewell; H. Fredrick Hamann

[57] ABSTRACT

A simple technique and circuit is disclosed to replace prior Z-θ type discriminators in supplying the loading and phasing control signals to the impedance matching network in an automatic antenna tuner. The new circuit samples forward and reflected voltage $V_f$ and $V_r$ (or equivalently $I_f$ and $I_r$) in the RF input. The loading control signal is supplied according to the in-phase component of $V_r$ relative to $V_f$. The phasing control signal is supplied according to the quadrature component of $V_r$ relative to $V_f$. The magnitude of each of the in-phase and quadrature $V_r$ components is reduced to zero by the matching network to thus reduce the phasor amplitude of $V_r$ to zero and hence eliminate reflected voltage.

8 Claims, 5 Drawing Figures

ANTENNA TUNER DISCRIMINATOR

TECHNICAL FIELD

The invention relates to antenna tuners for matching the impedance of an antenna to a desired RF input impedance.

BACKGROUND

Prior antenna tuners use Z-$\theta$ type discriminators. Z, e.g., 50 ohms, is the ratio of voltage to current on the RF input. Theta is the phase angle between the input voltage and current. The sensed Z and $\theta$ drive the loading and phasing servos of an impedance matching network, FIG. 1.

An objection to these prior Z-$\theta$ discriminators is the plurality of sensors which must be coupled to the RF input. For example, some discriminators require a voltage sensor and a current sensor for detecting Z, and a voltage sensor and a current sensor for detecting $\theta$, a total of four sensors. Another objection is the undesirable harmonic radiation caused by diode RF rectifiers required by these types of discriminators. A further objection is the complexity and high cost of such circuitry.

A need exists for a simple and inexpensive circuit for supplying the loading and phasing control signals in an automatic antenna tuner. There is a need to reduce the number of sensors coupled to the RF input. There is also a need to eliminate harmonic radiation due to diode RF rectifiers. There is still a further need to provide useful loading and phasing control signals in the presence of extreme mismatch conditions at the tuner input, as well as to achieve uniform sensitivity to tuning error across a wide frequency band, such as 2 to 30 MHz. The present invention satisfies these and other needs in a particularly simple and efficient manner.

SUMMARY

The present invention provides an apparatus and technique for supplying the loading and phasing control signals in an automatic antenna tuner. In-phase and quadrature components of reflected voltage $V_r$ on the RF input are sensed, and signals responsive thereto are supplied as the loading and phasing control signals to the impedance matching network in the antenna tuner. The magnitude of each of the in-phase and quadrature $V_r$ components is reduced to zero to thus reduce the phasor amplitude of $V_r$ to zero and hence eliminate reflected voltage. Equivalently, the in-phase and quadrature components of reflected current $I_r$ are sensed and supply the loading and phasing control signals.

In preferred form, a directional coupler senses forward and reflected voltage $V_f$ and $V_r$ in the RF input. A first demodulator receives $V_r$ and $V_f$ from the directional coupler and outputs a voltage amplitude proportional to the in-phase component of $V_r$ relative to $V_f$. A second demodulator receives $V_r$ and $V_f$ through phase shift means providing a 90° relative phase shift between $V_r$ and $V_f$ such that the second demodulator outputs an amplitude proportional to the quadrature component of $V_r$ relative to $V_f$. The outputs of the first and second demodulators are the loading and phasing control signals, respectively. The directional coupler also senses forward and reflected current $I_f$ and $I_r$, and the same circuitry is used for supplying the in-phase and quadrature components of the reflected current wave relative to the forward current wave, with a reversal in sign of the reflected wave and of the demodulator outputs.

In the preferred embodiment, only a single sensor is needed in the RF input, thus eliminating the plural sensor requirement above noted. Furthermore, the invention enables operation without harmonic generating rectifiers; for example, the demodulators may be linear multiplier devices which have linear input impedances. Furthermore, the invention enables operation in the presence of extreme mismatch conditions at the tuner input, as well as achieving uniform sensitivity to tuning error across a wide frequency band.

DETAILED DESCRIPTION

Figure 1:
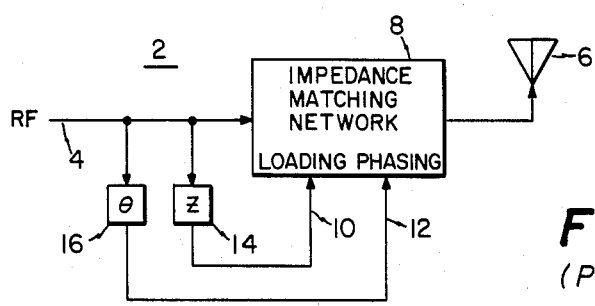
FIG. 1 is a schematic illustration of a prior art antenna tuner.

FIG. 1 shows an antenna tuner 2 known in the art. An RF signal on input coaxial line 4 is to be transmitted rightwardly to antenna 6 which radiates the RF signal. An impedance matching network 8 matches the output load impedance (antenna) to the input coaxial line impedance to prevent a standing wave on the input coaxial line. Network 8 receives loading and phasing control signals 10 and 12 which drive servos or the like for controlling magnitude and phase between voltage and current such that network 8 presents the desired input impedance, e.g., 50 ohms, which impedance is resistive only, not inductive or capacitive. As is well known, the loading and phasing servos, for example, control variable capacitors and inductors in a variety of L, T, pi, etc. configurations in network 8. The loading and phasing control signals 10 and 12 are supplied by Z-$\theta$ type discriminators 14 and 16 which have voltage and current sensors coupled to the RF input 4 for sensing impedance as the ratio of the RF voltage and current, and for detecting the phase angle between the voltage and current.

Figure 2:
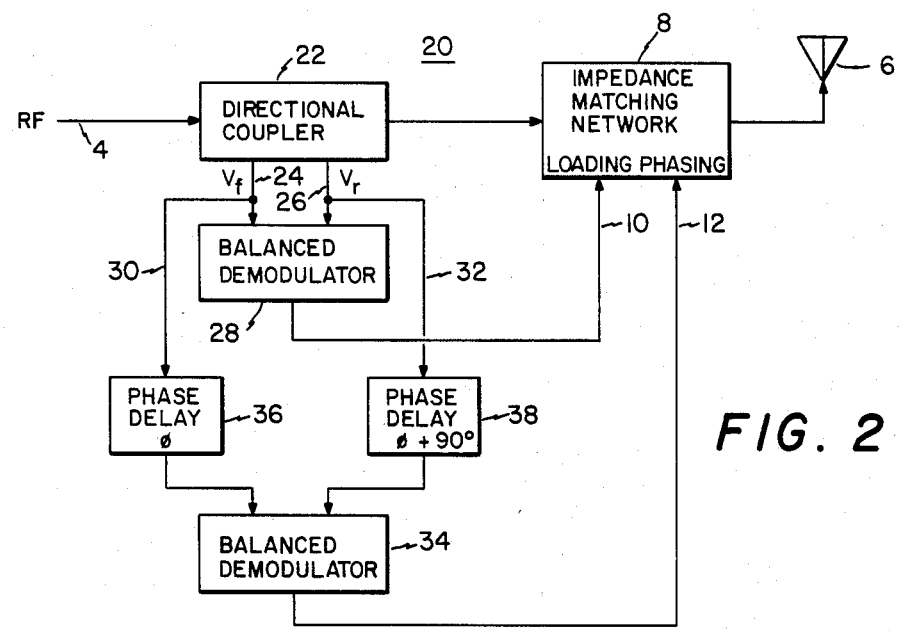
FIG. 2 is a schematic illustration of an antenna tuner like FIG. 1 but showing the improvement of the present invention.

The present invention provides an improved technique and circuitry for supplying the loading and phasing control signals 10 and 12. Referring to FIG. 2, an antenna tuner 20 is shown constructed in accordance with the invention, and like reference characters from FIG. 1 are used where appropriate to facilitate understanding.

Figure 3:
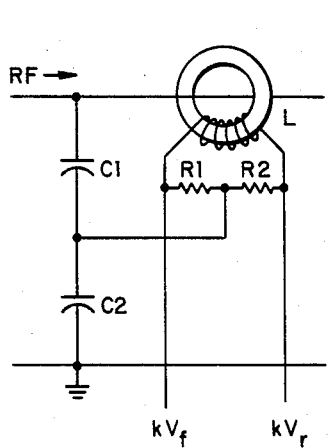
FIG. 3 is a schematic illustration of a directional coupler.

A directional coupler 22 is interposed in RF output line 4. A directional coupler samples the forward and reflected voltages $V_f$ and $V_r$, and forward and reflected current $I_f$ and $I_r$, for example as shown in "An Inside Picture of Directional Wattmeters", Warren B. Bruene, *QST*, April, 1959, pp. 24–28. As another example, FIG. 3 illustrates a directional coupler which uses lumped constant elements. The coupler elements are chosen so that when the RF line through the coupler is terminated with the desired load impedance, such as 50 ohms, the voltage across resistor R1 is in-phase and equal to the voltage out of the capacitive voltage divider C1, C2. The voltage across resistor R2 is equal but opposite in phase and hence $V_r$ is zero, which it should be for a matched load. When the load impedance is other than 50 ohms, for example, $V_r$ represents the reflected voltage wave. In the example, k is a constant, R1 equals R2 and each is very much less than the impedance of coil L. Other circuit variations are possible, such as replacing the capacitive voltage divider with a transformer or autotransformer or a resistive voltage divider. Other means of adding the voltage and current samples could be employed also.

Referring to FIG. 2, voltages $V_f$ and $V_r$ are fed on lines 24 and 26 to a multiplier, phase detector or balanced demodulator 28, such as a Signetics N5596 linear IC. $V_f$ and $V_r$ are fed to the carrier and signal input terminals of balanced demodulator 28. The demodulator output has a dc component whose amplitude is proportional to the in-phase component of $V_r$ relative to $V_f$. This proportional amplitude output is supplied to impedance matching network 8 as loading control signal 10. A low pass filter in balanced demodulator 28 removes RF components from its output.

$V_f$ and $V_r$ are also supplied on lines 30 and 32 through phase shift means to a second multiplier, phase detector or balanced demodulator 34, such as a Signetics N5596. The phase shift means provides a 90° relative phase shift between $V_r$ and $V_f$, and in preferred form is afforded by a pair of phase delays 36 and 38, one of which provides 90° more phase delay than the other. The demodulator 34 output has a dc component whose amplitude is proportional to the quadrature component of $V_r$ relative to $V_f$. This proportional amplitude output is supplied as phasing control signal 12 to impedance matching network 8. A low pass filter in demodulator 34 removes RF components from its output.

Figures 4, 5:
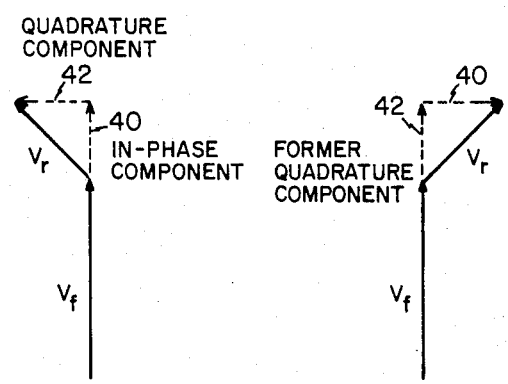
FIGS. 4 and 5 are vector diagrams illustrating the in-phase and quadrature component detection of $V_r$.

Referring to FIGS. 4 and 5, two RF voltage samples are obtained, one representing the forward voltage $V_f$ and the other representing the reflected voltage $V_r$. First demodulator 28 detects the in-phase component 40 of $V_r$ relative to $V_f$, FIG. 4, and supplies loading control signal 10 in response thereto. Second demodulator 34 detects the quadrature component 42 of $V_r$ relative to $V_f$, FIG. 5, and supplies phasing control signal 12 in response thereto.

The vector $V_r$ has been rotated clockwise by 90° from FIG. 4 to a FIG. 5 because phase shift means 38 has 90° more phase delay than phase shift means 36. This in turn shifts the in-phase component 40 in FIG. 4 to a quadrature component in FIG. 5. Likewise, the quadrature component 42 in FIG. 4 becomes an in-phase component in FIG. 5 relative to $V_f$. Phase shift means 36 and 38 provide the 90° relative phase shift of vector $V_r$ such that the second demodulator 34 detects component 42 as in-phase and thus outputs an amplitude on line 12 which is proportional to the in-phase component 42, FIG. 5, which was the quadrature component of $V_r$ prior to the differential phase shifting. The loading and phasing control signals 10 and 12 drive network 8 until the magnitude of each of the in-phase and quadrature $V_r$ components 40 and 42 is reduced to substantially zero to thus reduce the phasor amplitude of $V_r$ to substantially zero and hence substantially eliminate reflected voltage on the input coaxial line 4.

If desired, the in-phase and quadrature components of the reflected current wave relative to the forward current wave may of course be used instead of the voltage components. The circuitry is the same, and the only difference is a reversal in the sign of the reflected wave sample and of the demodulator outputs.

In the preferred embodiment, the invention needs only a single sensor coupling connection to the RF input 4 at directional coupler 22. Furthermore, the problem of harmonic generation is eliminated because the invention enables the use of linear IC's, such as demodulators 28 and 34, which do not employ harmonic generating rectifiers. Buffer amplifiers may optionally be provided at the inputs of the balanced demodulators 28 and 34 for further isolation if desired. Low pass filters may also be inserted if isolation from higher order components is desired. In addition to the loading and phasing servos to be driven by signals 10 and 12 which usually involve a motor running a continuously tuned element, signals 10 and 12 can also be used to command binary switched elements, e.g., a plurality of capacitors in parallel, inductors in series, etc. which are switched in predetermined configurations to yield desired values.

It is recognized that various modifications are possible within the scope of the appended claims.

I claim:

1. In the method of antenna tuning wherein loading and phasing control signals are supplied to an impedance matching network for matching an RF input impedance, an improved technique for supplying said loading and phasing control signals comprising:
    sensing forward and reflected voltage samples $V_f$ and $V_r$, respectively, on said RF input;
    sensing the magnitude of the in-phase component of $V_r$ relative to $V_f$ and supplying a proportional amplitude as said loading control signal;
    sensing the magnitude of the quadrature component of $V_r$ relative to $V_f$ and supplying a proportional amplitude as said phasing control signal;
    such that the magnitude of each of said in-phase and quadrature $V_r$ components is reduced to substantially zero to thus reduce the phasor amplitude of $V_r$ to substantially zero and hence substantially eliminate reflected voltage.

2. In an antenna tuner having an impedance matching network for matching an RF input according to loading and phasing control signals supplied to said impedance matching network, improved means for supplying said loading and phasing control signals comprising:
    directional coupler means for sensing forward and reflected voltage $V_f$ and $V_r$ in said RF input;
    first detector means for detecting the in-phase component of $V_r$ relative to $V_f$ and supplying said loading control signal in response thereto; and
    second detector means for detecting the quadrature component of $V_r$ relative to $V_f$ and supplying said phasing control signal in response thereto, such that the phasor amplitude of $V_r$ is reduced to substantially zero.

3. The invention according to claim 2 wherein:
    said first detector means comprises demodulator means receiving $V_r$ and $V_f$ from said directional coupler means and outputting an amplitude proportional to the in-phase component of $V_r$ relative to $V_f$; and
    said second detector means comprises second demodulator means receiving $V_r$ and $V_f$ through phase shift means providing a 90° relative phase shift between $V_r$ and $V_f$ such that said second demodulator means outputs an amplitude proportional to the quadrature component of $V_r$ relative to $V_f$.

4. An antenna tuner comprising:
    an impedance matching network for matching an RF input according to loading and phasing control signals supplied to said impedance matching network;

directional coupler means for sensing forward and reflected voltage $V_f$ and $V_r$ in said RF input;

first detector means receiving $V_r$ and $V_f$ from said directional coupler means for detecting the in-phase component of $V_r$ relative to $V_f$ and supplying said loading control signal in response thereto; and second detector means receiving $V_r$ and $V_f$ from said directional coupler means through phase shift means providing a 90° relative phase shift between $V_r$ and $V_f$, for detecting the quadrature component of $V_r$ relative to $V_f$ and supplying said phasing control signal in response thereto, such that the phase amplitude of $V_r$ is reduced to substantially zero.

5. In the method of antenna tuning wherein loading and phasing control signals are supplied to an impedance matching network for matching an RF input impedance, an improved technique for supplying said loading and phasing control signals comprising:

sensing forward and reflected current samples $I_f$ and $I_r$, respectively, on said RF input;

sensing the magnitude of the in-phase component of $I_r$ relative to $I_f$ and supplying a proportional amplitude as said loading control signal;

sensing the magnitude of the quadrature component of $I_r$ relative to $I_f$ and supplying a proportional amplitude as said phasing control signal;

such that the magnitude of each of said in-phase and quadrature $I_r$ components is reduced to substantially zero to thus reduce the phasor amplitude of $I_r$ to substantially zero and hence substantially eliminate reflected current.

6. In an antenna tuner having an impedance matching network for matching an RF input according to loading and phasing control signals supplied to said impedance matching network, improved means for supplying said loading and phasing control signals comprising:

directional coupler means for sensing forward and reflected current $I_f$ and $I_r$ in said RF input;

first detector means for detecting the in-phase component of $I_r$ relative to $I_f$ and supplying said loading control signal in response thereto; and second detector means for detecting the quadrature component of $I_r$ relative to $I_f$ and supplying said phasing control signal in response thereto, such that the phasor amplitude of $I_r$ is reduced to substantially zero.

7. The invention according to claim 6 wherein:

said first detector means comprises demodulator means receiving $I_r$ and $I_f$ from said directional coupler means and outputting an amplitude proportional to the in-phase component of $I_r$ relative to $I_f$; and said second detector means comprises second demodulator means receiving $I_r$ and $I_f$ through phase shift means providing a 90° relative phase shift between $I_r$ and $I_f$ such that said second demodulator means outputs an amplitude proportional to the quadrature component of $I_r$ relative to $I_f$.

8. An antenna tuner comprising:

an impedance matching network for matching an RF input according to loading and phasing control signals supplied to said impedance matching network;

directional coupler means for sensing forward and reflected current $I_f$ and $I_r$ in said RF input;

first detector means receiving $I_r$ and $I_f$ from said directional coupler means for detecting the in-phase component of $I_r$ relative to $I_f$ and supplying said loading control signal in response thereto; and second detector means receiving $I_r$ and $I_f$ from said directional coupler means through phase shift means providing a 90° relative phase shift between $I_r$ and $I_f$, for detecting the quadrature component of $I_r$ relative to $I_f$ and supplying said phasing control signal in response thereto, such that the phasor amplitude of $I_r$ is reduced to substantially zero.

* * * * *